United States Patent
Huang et al.

(10) Patent No.: US 6,352,918 B1
(45) Date of Patent: *Mar. 5, 2002

(54) METHOD OF FORMING INTER-METAL INTERCONNECTION

(75) Inventors: Yimin Huang, Taichung Hsien; Chih-Chien Liu, Taipei; Tri-Rung Yew, Hsinchu Hsien, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,877

(22) Filed: Nov. 24, 1998

(51) Int. Cl.⁷ .............................. H01L 21/311

(52) U.S. Cl. ...................... 438/623; 438/725

(58) Field of Search ................ 438/623, 624, 438/725, FOR 355

(56) References Cited

U.S. PATENT DOCUMENTS

| | | | | |
|---|---|---|---|---|
| 4,519,872 A | * | 5/1985 | Anderson, Jr. et al. | |
| 5,880,018 A | * | 3/1999 | Boeck et al. | |
| 6,071,809 A | * | 6/2000 | Zhao | |
| 6,191,028 B1 | * | 2/2001 | Huang et al. | |

OTHER PUBLICATIONS

S. Wolf, "Silicon Preocessing for the VLSI Era", Lattice Press, vol. 2, pp. 229–235, 1990.*

* cited by examiner

*Primary Examiner*—George Fourson
*Assistant Examiner*—Joannie Adelle Garcia
(74) *Attorney, Agent, or Firm*—J.C. Patents

(57) ABSTRACT

A method of forming an inter-metal interconnection is provided. A substrate is provided. A dielectric layer with a metal plug therein is formed on the substrate. An IMD layer is formed on the dielectric layer. An insulating layer and a PE-oxide layer are formed on the IMD layer. A photolithography and etching process is performed to form a trench in the IMD layer and to expose the metal plug in the dielectric layer. A metal is filled into the trench to electrically connect to the metal plug.

2 Claims, 3 Drawing Sheets

METHOD OF FORMING INTER-METAL INTERCONNECTION

BACKGROUND OF THE INVENTION

1. Field of the Invention

The invention relates in general to the fabrication of damascene, and more particularly to a method of forming inter-metal dielectric (IMD) using a material with low dielectric constant (k).

2. Description of the Related Art

A previous method used to form metal interconnections comprises steps of depositing a metal layer on a substrate, defining the metal layer to form an interconnection layer and forming a dielectric layer on the interconnecting layer. The metal layer reflects light during a photolithography and etching process so that the method easily causes error while defining the metal layer. Furthermore, etching the metal layer is more difficult than etching the dielectric layer because of the characteristics of the metal layer.

According to the disadvantage of the previous method, a damascene process is provided. The damascene process comprises steps of forming a dielectric layer on a substrate, forming a trench in the dielectric layer and filling a metal plug in the trench. FIGS. 1A to 1C are cross-sectional views showing a conventional damascene process.

In FIG. 1A, a substrate 100 with a planar top surface is provided. The substrate 100 comprises some devices or structures formed thereon, but not shown in the figure. A dielectric layer 102 is formed on the substrate 100. In the dielectric layer 102, a metal plug 103 is formed to connect to the substrate 100.

An IMD layer 104 is formed on the dielectric layer 102. A defined photoresist layer 106 is provided on the IMD layer 104. According to the defined photoresist layer 106, a part of the IMD layer 104 is removed to form a trench 107 in the IMD layer 104a and to expose the metal trench 103 as shown in FIG. 1B. After removing the photoresist layer 106, metal 108 is filled into the trench 107 to form the structure shown in FIG. 1C.

In the damascene process, spin-on organic polymers with a low dielectric constant, such as Flare, SILK and PAE-II, are usually used to reduce interconnection parasitic capacitance, to reduce the RC delay and to mitigate cross talk between metal layers, hence, the operation speed is improved. Therefore, the low k dielectric layer is a very popular IMD material used in a high-speed integrated circuit (IC).

Similar to the material contained in photoresist layers, the material contained in the organic polymers used as IMD layers has a large proportion of carbon. The IMD layers are removed while removing the photoresist layers because of bad selectivity of the IMD layers and of the photoresist layer. That result reduces the efficiency of the photoresist layers.

An oxide layer, which is formed by plasma-enhanced chemical vapor deposition (PECVD), is usually formed on an IMD layer as a protecting layer. The PE-oxide layer is used as a hard mask to protect the IMD layer from being removed during an etching process. However, using the PE-oxide layer causes some disadvantages. For example, a plasma containing oxygen used to form the PE-oxide layer destroys the surface of the IMD layer during oxide layer formation. The destruction degrades the characteristics of the low-k IMD layer. The destruction also makes the oxide layer have a bad adhesion to the IMD layer. When the IMD layer is etched to form a trench therein or a planarization process is performed, the oxide layer may peel due to the bad adhesion. The protecting efficiency of the oxide layer is thus decreased. The peeling oxide layer causes contamination.

SUMMARY OF THE INVENTION

It is therefore an object of the invention to provide an improved method of forming an inter-metal interconnection to protect the IMD layer from being destroyed during PE-oxide layer formation. The method further prevents the low k IMD layer from being degraded and avoids the IMD layer peeling due to bad adhesion.

The invention achieves the above-identified objects by providing a method of forming an inter-metal interconnection. A substrate is provided. A dielectric layer with a metal plug therein is formed on the substrate. An IMD layer is formed on the dielectric layer. An insulating layer and a PE-oxide layer are formed on the IMD layer. A photolithography and etching process is performed to form a trench in the IMD layer and to expose the metal trench in the dielectric layer. The trench is filled with metal to electrically connect to the metal plug.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
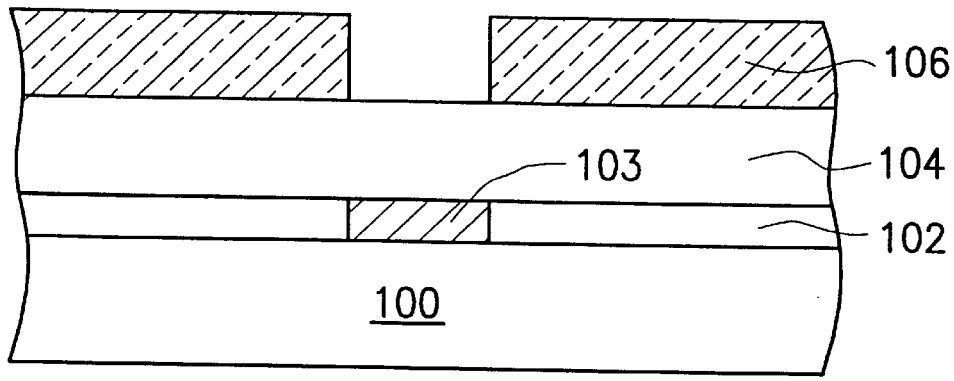
FIGS. 1A to 1C are schematic, cross-sectional views showing a conventional damascene process.
Figure 1B:
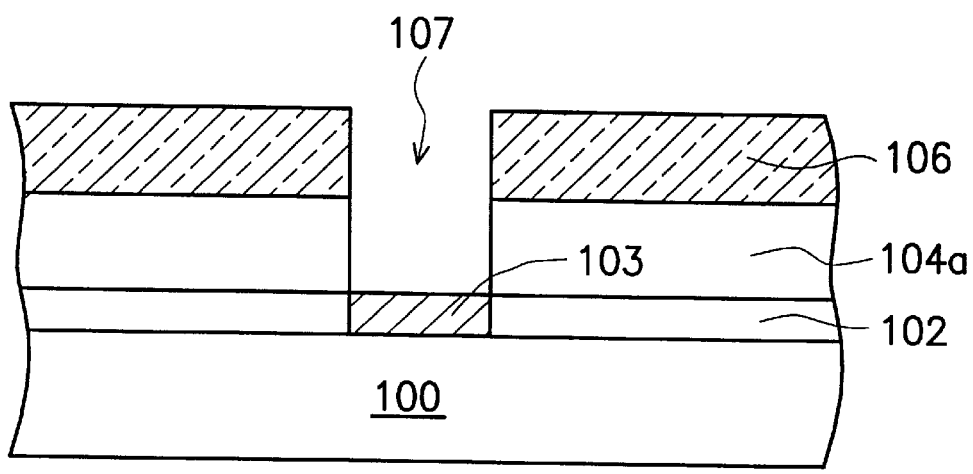
Figure 1C:
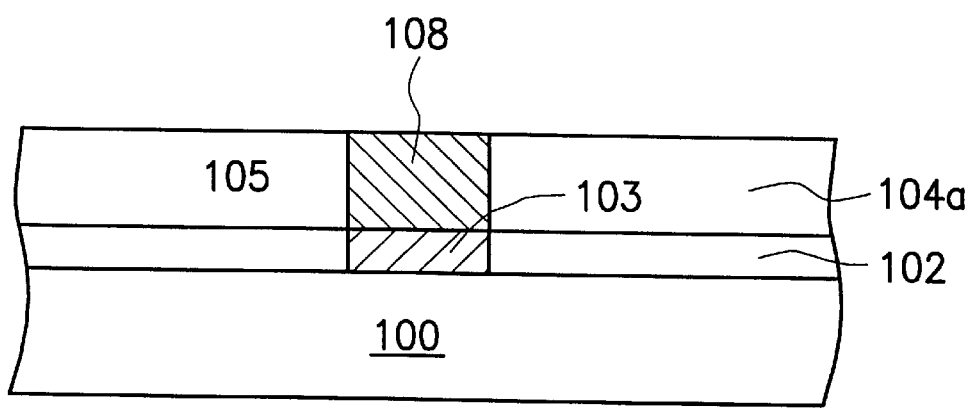
Figure 2A:
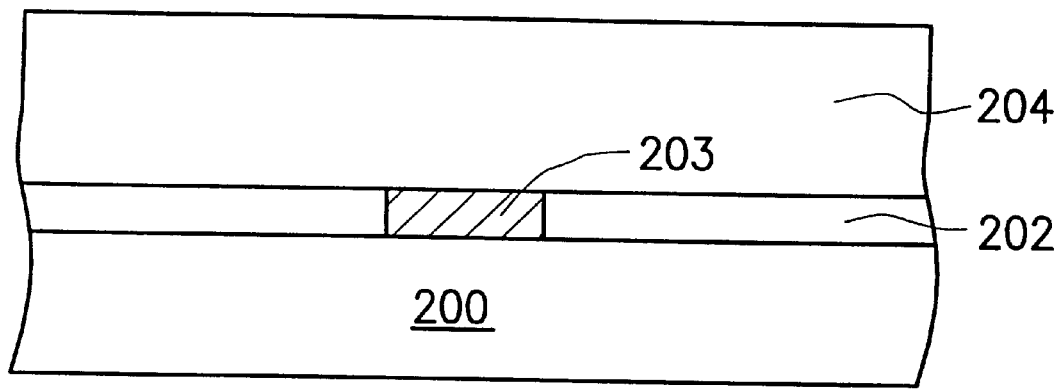
FIGS. 2A to 2E are schematic, cross-sectional views showing the process steps of one preferred embodiment of the method of forming an inter-metal interconnection.

In FIG. 2A, a substrate 200 with a planar surface is provided. There are some devices, such as MOS transistors or conductive structures, (not shown) formed on the substrate 200. A dielectric layer 202 is formed on the substrate 200. A metal plug 203, such as a tungsten plug, is formed in the dielectric layer 202 and electrically couples with the substrate 200. An inter-metal dielectric (IMD) layer 204 is formed on the dielectric layer 202 with a thickness of about 5000–7000 Å. A material of the IMD layer 204 has a low dielectric constant (k) and comprises Flare, SILK, Parylene and PAEII etc. organic low k materials. Forming the IMD layer comprises steps of forming the material on the dielectric layer using spin-on and of performing a post-baking step to remove a solvent contained in the material.

Figure 2B:
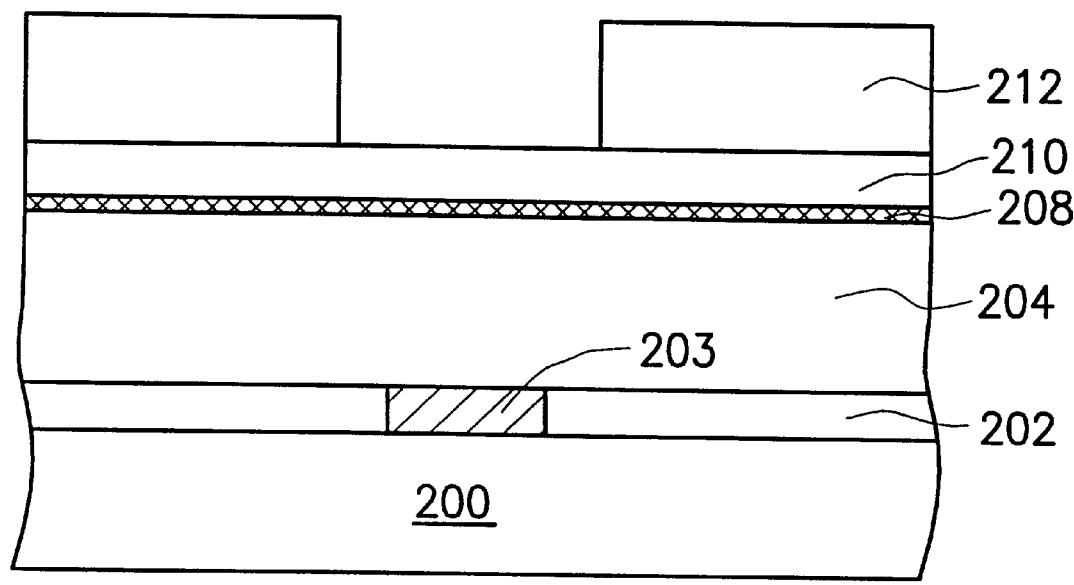

In FIG. 2B, a liner layer 208 is formed on the IMD layer 204. Forming the liner layer 208, for example, comprises steps of spinning on a material having good adhesion to silicon oxide and IMD layer 204, and baking and curing the material to form the liner layer 208. The preferable liner layer 208 is an inorganic material or a material whose chemistry is between inorganic and organic. A silicon oxide layer 210 is formed on the liner layer 208 by plasma-enhanced chemical vapor deposition (PECVD), for example. A defined photoresist layer 212 is provided on the silicon oxide layer 210. A part of the silicon oxide layer 210 is exposed according to a pattern of the defined photoresist layer 212.

Figure 2C:
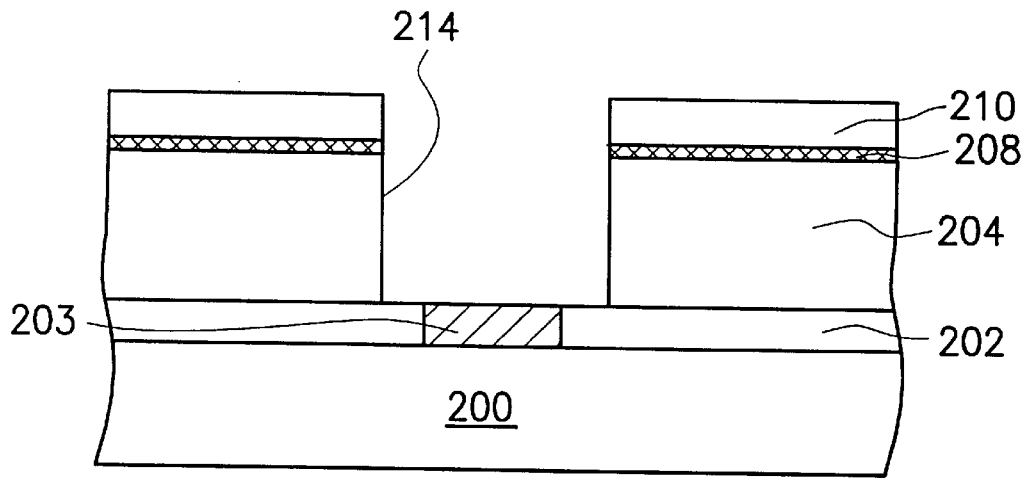

In FIG. 2C, the exposed silicon oxide layer 210, the liner layer 208 under the silicon oxide layer 210 and the IMD layer 204 are removed sequentially until exposing the metal plug 203 to form a trench 214. The step also can form a dual damascene structure (not shown), which comprises a trench and a via, in the IMD layer 204. This embodiment only forms a trench 214 to illustrate the invention.

Figure 2D:
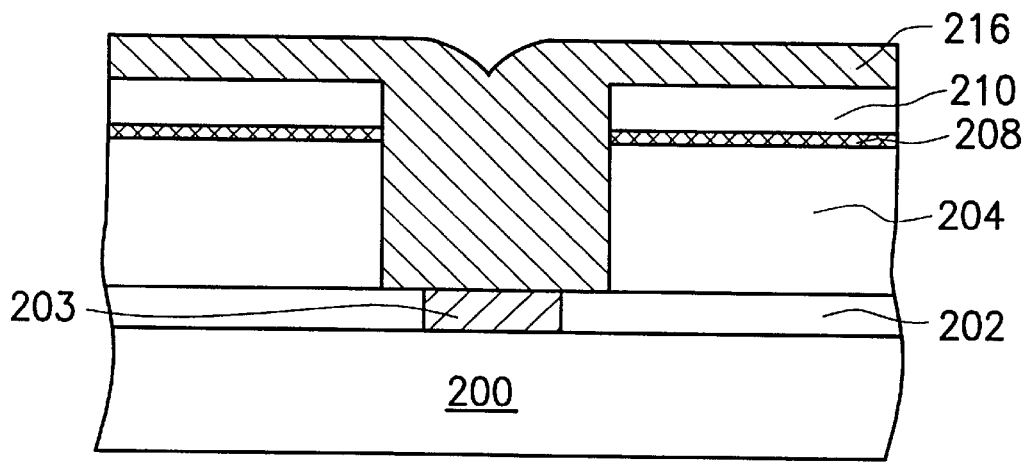

In FIG. 2D, a metal layer 216 is formed on the structure shown in FIG. 2C and fills the trench 214. The metal layer 216 comprises a material such as copper, aluminum or aluminum copper alloy.

Figure 2E:
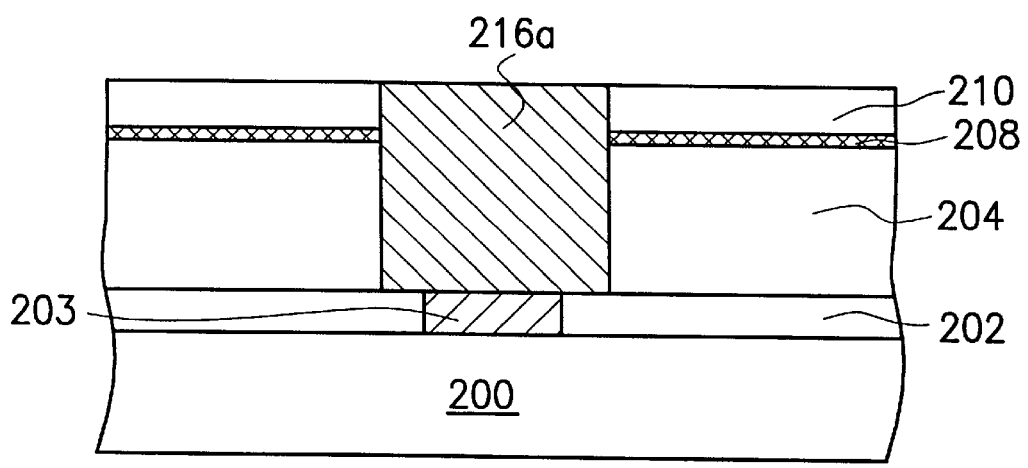

In FIG. 2E, the metal layer 216 not in the trench 214 is removed to form a metal line 216a, for example, by chemical-mechanical polishing (CMP). The metal line 216a electrically couples with the metal plug 203.

Since the IMD layer is covered by a liner layer, the surface of the IMD layer is not destroyed while depositing the oxide layer. Degradation of the low k IMD layer is thus avoided. Furthermore, the liner layer enhances the adhesion of silicon oxide to the IMD layer, so that the peeling of silicon oxide layer can be prevented during trench formation or removing the extra metal layer not in the trench.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming inter-metal interconnection adapted on a substrate having a dielectric layer and a metal plug in the dielectric layer, comprising the steps of:

forming an inter-metal dielectric layer on the dielectric layer of the substrate, wherein the inter-metal dielectric layer is made of organic low-k materials;

forming a silicon oxide layer over the inter-metal dielectric layer;

forming a spin-on inorganic liner layer on the inter-metal dielectric layer directly under the silicon oxide layer, thereby to improve adhesion with the inter-metal dielectric layer and the silicon oxide layer;

forming a trench in the inter-metal dielectric layer;

forming a metal layer on the silicon oxide layer and to completely fill the trench, wherein the metal layer in the trench is at least level with a surface of the silicon oxide layer; and using the silicon oxide layer as a stop layer to polish the metal layer, such that a metal line having a surface which is level with that of the silicon oxide layer is formed and the silicon oxide layer is exposed.

2. A method of forming inter-metal interconnection adapted on a substrate having a dielectric layer and a metal plug in the dielectric layer, comprising the steps of:

forming an inter-metal dielectric layer on the dielectric layer of the substrate, wherein the inter-metal dielectric layer has a thickness of about 5000–7000 Å;

forming a silicon oxide layer over the inter-metal dielectric layer;

forming a spin-on inorganic liner layer on the inter-metal dielectric layer directly under the silicon oxide layer, thereby to improve adhesion with the inter-metal dielectric layer and the silicon oxide layer;

forming a trench in the inter-metal dielectric layer;

forming a metal layer on the silicon oxide layer and to completely fill the trench, wherein the metal layer in the trench is at least level with a surface of the silicon oxide layer; and using the silicon oxide layer as a stop layer to polish the metal layer, such that a metal line having a surface which is level with that of the silicon oxide layer is formed and the silicon oxide layer is exposed.

* * * * *